(12) United States Patent
Zheng

(10) Patent No.: US 8,283,792 B1
(45) Date of Patent: Oct. 9, 2012

(54) METHODS AND SYSTEMS FOR FORMING AN ALIGNMENT MARK WITH OPTICALLY MISMATCHED ALIGNMENT MARK STACK MATERIALS

(75) Inventor: Yi Zheng, San Ramon, CA (US)

(73) Assignee: Hitachi Global Storage Technologies, Netherlands B.V., Amsterdam (NL)

( * ) Notice: Subject to any disclaimer, the term of this patent is extended or adjusted under 35 U.S.C. 154(b) by 457 days.

(21) Appl. No.: 12/001,950

(22) Filed: Dec. 12, 2007

Related U.S. Application Data

(63) Continuation-in-part of application No. 10/928,466, filed on Aug. 26, 2004, now Pat. No. 7,449,790.

(51) Int. Cl.
*H01L 23/544* (2006.01)

(52) U.S. Cl. .......... 257/797; 257/E23.179; 257/E23.191

(58) Field of Classification Search .................... 257/797
See application file for complete search history.

(56) References Cited

U.S. PATENT DOCUMENTS

| | | | | |
|---|---|---|---|---|
| 5,869,383 A * | 2/1999 | Chien et al. | ..... | 438/401 |
| 5,904,563 A | 5/1999 | Yu | ..... | 438/672 |
| 6,054,361 A | 4/2000 | Tan et al. | ..... | 438/401 |
| 6,060,786 A * | 5/2000 | Wang | ..... | 257/797 |
| 6,076,252 A | 6/2000 | Sasaki | ..... | 29/603.1 |
| 6,242,816 B1 | 6/2001 | Stanton et al. | ..... | 257/797 |
| 6,248,484 B1 | 6/2001 | Sajan et al. | | |
| 6,259,585 B1 | 7/2001 | Sasaki et al. | ..... | 360/317 |
| 6,271,602 B1 | 8/2001 | Ackmann et al. | | |
| 6,399,285 B1 | 6/2002 | Kamijima | ..... | 430/313 |
| 6,420,791 B1 * | 7/2002 | Huang et al. | ..... | 257/797 |
| 6,451,668 B1 | 9/2002 | Neumeier et al. | ..... | 438/401 |
| 2002/0192926 A1 | 12/2002 | Schroeder et al. | ..... | 438/401 |
| 2003/0071369 A1 * | 4/2003 | Huang et al. | ..... | 257/797 |
| 2003/0127751 A1 | 7/2003 | Yamada et al. | | |

FOREIGN PATENT DOCUMENTS

| | | |
|---|---|---|
| JP | 1030220 | 2/1989 |
| JP | 1117027 | 5/1989 |
| JP | 1206347 | 8/1989 |
| JP | 5143932 | 6/1993 |
| JP | 7176018 | 7/1995 |
| JP | 8203029 | 8/1996 |
| JP | 10133397 | 5/1998 |
| JP | 10162316 | 6/1998 |
| JP | 2000173018 | 6/2000 |
| JP | 2002367111 | 12/2002 |
| JP | 2003140366 | 5/2003 |

* cited by examiner

*Primary Examiner* — David Zarneke

(57) ABSTRACT

Methods for fabricating an alignment mark are disclosed. A method includes forming a base layer that includes a first material and forming an alignment mark layer above the base layer that includes a second material that is optically mismatched with the first material. The alignment mark is formed using both first and second layers.

2 Claims, 17 Drawing Sheets

| Metal A (20nm step) | Metal B (1um base) | | | | | |
|---|---|---|---|---|---|---|
| | NiFe | Ta | Cu | Rh | CoFe | W |
| TA | 7.4 | 4 | 39 | 39 | 5.5 | 2.4 |
| Cu | 0.5 | 1.8 | 6.8 | 1 | 1.5 | 0.6 |
| Rh | 5.8 | 3.8 | 36 | 4.5 | 3.2 | |
| CoFe | 17 | 14 | 70 | 16 | 8.6 | 11 |
| NiFe | 6.3 | 4.5 | 40 | 6 | 2.5 | 3.8 |
| W | 11.3 | 6 | 46 | 8.4 | 10.5 | 3 |
| Ta | | 63.2 | | | | |

FIG. 5

METHODS AND SYSTEMS FOR FORMING AN ALIGNMENT MARK WITH OPTICALLY MISMATCHED ALIGNMENT MARK STACK MATERIALS

RELATED U.S. APPLICATIONS

This application is a continuation-in-part of patent application Ser. No. 10/928,466, entitled "Methods and Systems of Enhancing Stepper Alignment Signals and Metrology Alignment Target Signals," with filing date Aug. 26, 2004 now U.S. Pat. No. 7,449,790, which is hereby incorporated herein in its entirety.

FIELD OF THE INVENTION

Embodiments in accordance with the present invention relate to the alignment of masks used in photolithographic manufacturing processes.

BACKGROUND

A disk storage system, such as a magnetic hard disk drive (HDD), uses one or more disks or "platters" as a data recording medium. The HDD records data on the disk by use of a magnetic recording head which can also reproduce data from the disk.

Increased levels of storage capacity in hard disk drives are the result of many improvements in a variety of areas, including, for example, finer head positioning, smaller read/write heads, and perpendicular recording.

An important factor in increasing storage capacity is to decrease the size of the recording (and reading) head. Such heads typically comprise multiple layers of various materials produced by photolithographic manufacturing processes, in a manner similar to those processes utilized to produce integrated circuits.

In a typical photolithographic manufacturing process, light energy is transmitted through a mask that defines particular features for a layer of the structure under construction. A typical process can include dozens of masks, which are utilized in a particular sequence. A "stepper" places each mask in sequence over the structure. Aligning the multiple individual masks is a very critical operation in such processes.

Conventional mask alignment processes utilize fiducial marks produced in a first layer to align a subsequent mask. For example, such a conventional fiducial mark comprises a periodic grating structure of varying heights, for example, two, heights. For alignment purposes, such a fiducial mark is illuminated by a laser to produce a diffraction pattern that is used to guide a stepper to place a next mask into proper position. A typical specification for depth of such a fiducial grating mark is that the relieved "groves" should be approximately 100 nm deep. Grooves of much less than 100 nm in depth typically do not produce sufficient pattern energy to align the mask with sufficient accuracy.

Unfortunately, it is desirable to construct magnetic read/write heads with some layers, e.g., a sensor or "read" layer, of significantly less thickness. For example, a desirable thin sensor layer is approximately 20 to 40 nm. A conventional fiducial grating mark of about 100 nm thick is not suited to use in such a thin sensor layer.

A conventional art approach utilized to overcome the limited depth available in thin layers, e.g., layers substantially thinner than a recommended fiducial grating mark depth, is to align subsequent layers to other layers that are thick enough to accommodate a recommended fiducial grating mark depth. Unfortunately, aligning to such other layers can lead to a deleterious build up of alignment tolerances. For example, thin layer B, aligned with a mark on layer A, is produced at a maximum acceptable misalignment in a particular direction with respect to layer A. Layer C, disposed adjacent to thin layer B, is also aligned to a mark on layer A, as thin layer B is unsuitable for a conventional alignment mark. Layer C is produced at a maximum acceptable misalignment in the opposite direction with respect to layer A. Consequently, under the conventional art, even though both layers B and C are within acceptable alignment specifications with respect to their alignment targets (on layer A), it is frequently the case that layers B and C exceed acceptable alignment specifications with respect to one another. Poor alignment between layers can, for example, result in poor function of the device and/or substantial yield loss.

SUMMARY OF THE INVENTION

Therefore, methods and systems of enhancing stepper alignment signals, especially for use with "thin" layers, are highly desired.

Accordingly, methods for fabricating an alignment mark are disclosed. The method includes forming a base layer that includes a first material and forming an alignment mark layer above the base layer that includes a second material that is optically mismatched with the first material. The alignment mark is formed using both first and second layers.

In accordance with another embodiment of the present invention, the alignment marks may have a height of less than about 50 nm.

In accordance with still another embodiment of the present invention, a variable length spacer layer is formed between the first material and the second material.

In accordance with still another embodiment of the present invention, the alignment mark is associated with a sensor layer.

BRIEF DESCRIPTION OF THE DRAWINGS

FIG. 5 shows a table of exemplary performance results for various combinations of alignment mark base and mark materials according to one embodiment.

DETAILED DESCRIPTION OF THE INVENTION

In the following detailed description of the present invention, methods and systems of enhancing stepper alignment signals and metrology alignment target signals, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

I. Enhancing Stepper Alignment Signals and Metrology Alignment Target Signals

Embodiments in accordance with the present invention are herein described in terms of magnetic recording heads for use in disk storage systems, e.g., a magnetic hard disk drive. It is to be appreciated that embodiments in accordance with the present invention are well suited to other devices employing and fabricated via photolithographic manufacturing processes, for example, integrated circuits.

Figure 1:
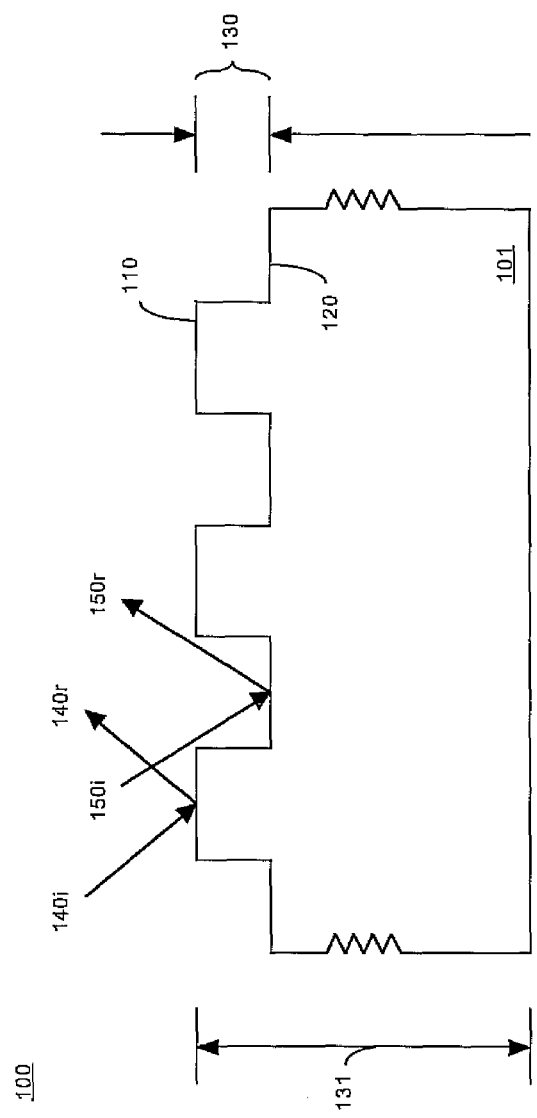
FIG. 1 illustrates a side sectional view of a mask alignment fiducial mark, in accordance with embodiments of the present invention.

FIG. 1 illustrates a side sectional view of mask alignment fiducial mark 100, in accordance with embodiments of the present invention. Mask alignment fiducial mark 100 is typically constructed in a layer of a photolithographic construction, e.g., layer 101 of a magnetic read/write head. It is appreciated that layer 101 generally comprises other features (not shown). It is generally desirable to align such features of layer 101 with features of other layers yet to be created on top of layer 101. More specifically, it is generally desirable to align features of subsequent layers to features of layer 101. A mask alignment fiducial mark is almost always utilized in such alignment processes.

Mask alignment fiducial mark 100 comprises a plurality of rows, e.g., row 110 and row 120, of varying heights. FIG. 1 illustrates a plurality of rows of two different heights. It is to be appreciated that embodiments in accordance with the present invention are well suited to a plurality of rows of a plurality of heights.

Height 130 illustrates a height difference between rows, for example, between row 110 and row 120. Row 110 can, for example, represent a surface of the layer 101 comprising mask alignment fiducial mark 100. Row 120 can, for example, represent a depth into, or relieved from, layer 101. Row 120 can be formed, for example, by removing material from the layer 101. It is to be appreciated that mask alignment fiducial mark 100 can be constructed by other methods, including, for example, adding material to the surface of a layer 101 to create rows above the surface.

Light rays 140i and 150i illustrate light incident onto parts of mask alignment fiducial mark 100. Light rays 140r and 150r illustrate light reflected from parts of mask alignment fiducial mark 100. In many stepper systems, a laser is used to illuminate mask alignment fiducial mark 100, while the reflected light is sensed and utilized to align subsequent masks to the layer 101. For example, the stepper alignment system senses a phase delta between reflected waves 140r and 150r. In general, the phase difference between light reflected from a "higher" row and light reflected from a "lower" row corresponds to the strength of an alignment signal. In most cases a stronger alignment signal enables more exacting alignment of subsequent masks to previous structures.

Under the conventional art, height 130 between adjacent rows is usually required to be about 100 nm. If height 130 decreases too far below this level, insufficient alignment signal is generated and alignment is frequently unacceptable.

For thin film magnetic heads, various layers, e.g., a "thin" sensor layer, are desirably significantly thinner than the about 100 nm difference required for conventional alignment marks. For example, a sensor layer can desirably be 20-40 nm thick. Layer 101, as indicated by height 131, is such a "thin" layer, approximately 20-40 nm thick.

It is to be appreciated that desired row height differences of about 100 nm cannot be achieved in cases, such as layer 101, in which the layer thickness is substantially less than the desired height.

In accordance with embodiments of the present invention, alternating rows of mask alignment fiducial mark 100 comprise selected surface treatments to enhance the contrast of mask alignment fiducial mark 100 when imaged by a stepper, as during a mask alignment process. For example, a metal film is applied to the upper surface of "tall" rows, e.g., row 110, and a different metal film is applied to the upper surface or the "lower" rows or wells, e.g., row 120. In accordance with embodiments of the present invention the two different films are selected to produce a mismatch between the complex refractive indexes (n and k values) of the two materials. It is appreciated that one or both rows may be formed from the material, as well as comprising a coating of the material.

For example, copper is characterized in that it has a complex refractive index (n, k) of (0.055, 1.89) for 633 nm (red) light, as is commonly used in stepper equipment for mask alignment. CoFe is characterized in that it has a complex refractive index (n, k) of (2.188, 5.732) for the same wavelength light. As 532 nm (green) light is also commonly used in stepper equipment for mask alignment, it is highly beneficial for the two materials to create a mismatch between the complex refractive index (n and k values) at this wavelength as well. For example, copper is characterized in that it has a complex refractive index (n, k) of (0.73, 1.441) for 532 nm (green) light, and CoFe is characterized in that it has a complex refractive index (n, k) of (1.937, 5) for the same wavelength light.

Other materials can be employed to create such mismatches between complex reflectivities. Various combinations of tantalum, copper, rhodium, CoFe, NiFe, tungsten and gold are well suited to embodiments in accordance with the present invention. For example, rhodium (2.612, 3.277) for 633 nm light, and (2.342, 3.112) for 532 nm light, can be used in place of CoFe in conjunction with copper. While rhodium does not produce quite the mismatch between complex refractive indexes as does CoFe in conjunction with copper, rhodium is more chemically stable than CoFe, and rhodium stands up well to other processing, e.g., Chemical Mechanical Planarization (CMP).

It is to be appreciated that in many, but not all, photolithographic manufacturing processes, an ion mill process produces such alignment marks. In such cases, milling time and milling rate for a particular material determine step height, or the difference between row heights. As a consequence, some materials can be removed to a deeper depth than others, for a given milling time. In general, deeper steps, or the difference between row heights, are more favorable than shallower steps in alignment marks. In accordance with embodiments of the present invention, materials utilized to form an alignment mark can be selected for favorable milling rates. For example, rhodium and copper in general are characterized as having greater milling rates than $Al_2O_3$, NiFe, CoFe or sensor materials.

Figure 2A:
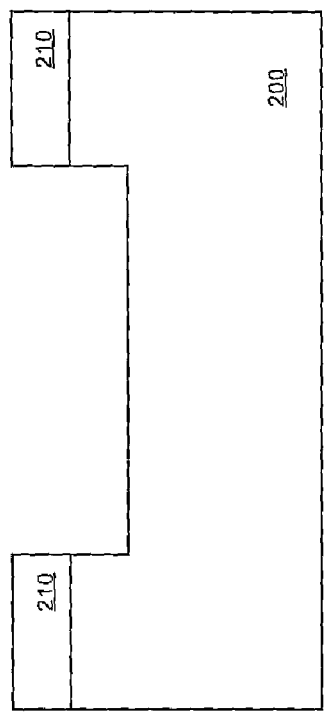
FIGS. 2A, 2B, 2C and 2D illustrate stages used in a method of manufacturing an alignment mark, in accordance with embodiments of the present invention.

FIGS. 2A-2D illustrate stages in a process of manufacturing an alignment mark, in accordance with embodiments of the present invention. FIG. 2A illustrates a side sectional view of layer 210 upon a base layer 200. Layers 210 and 200 can be part of a multi-layer structure such as is common in integrated circuit manufacturing as well as in the production of magnetic read/write heads. For example, layer 200 can be a "shield" layer of a magnetic head structure. In one embodiment, layer 210 can include a thin "sensor" layer of such a head structure. In one embodiment, layer 210 can include a bi-layer resist structure in addition to a thin "sensor" layer, and optionally, a "gap" layer (see discussion made with reference to FIGS. 7B-7D herein). It is appreciated that, in general, other layers of a variety of materials may be adjacent, e.g., above and/or below, layers 200 and 210. Furthermore, embodiments of the present invention are well suited to a structure comprising one or more layers of material between layers 200 and 210, e.g., an alumina "gap" layer.

In FIG. 2A, material of both layers has been removed, for example via an ion milling process, to create a region for an alignment mark. It is appreciated that the material removal has created a hole through layer 210 and a hole or depression into layer 200, forming a mark region.

Figure 2B:
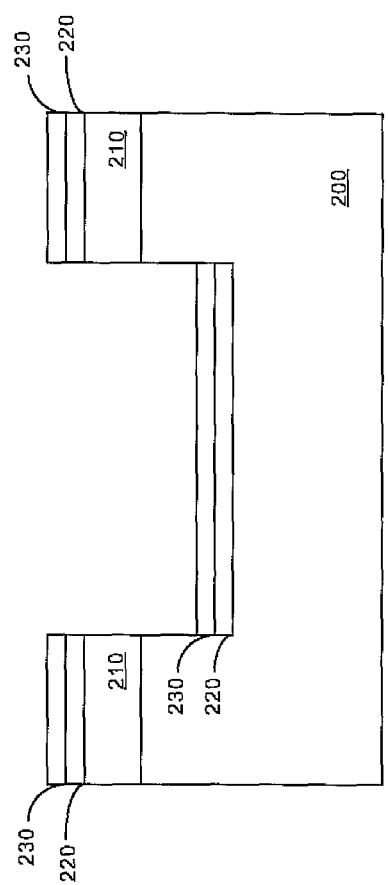

FIG. 2B illustrates the addition of thin metal films to layers 200 and 210. Metal film 220 can be, for example, copper, of about 100 nm in thickness. Metal film 230 can be, for example, rhodium, of about 20 nm thickness. It is appreciated that many metal application processes apply metal to most or all of a wafer. Consequently, the metal films 220 and 230 are shown to overlay both layers 200 and 210, although embodiments in accordance with the present invention are well suited to application of metal only to the mark region.

Figure 2C:
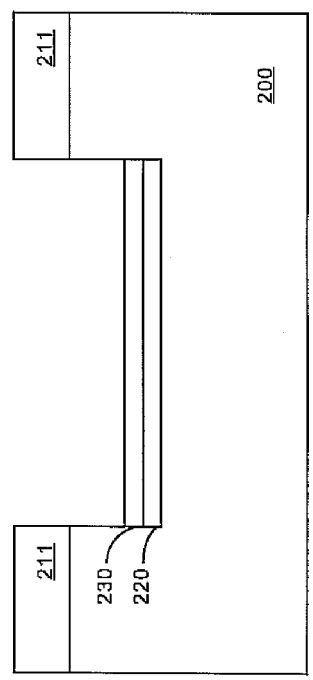

In FIG. 2C, metal films 220 and 230 are removed in regions above layer 210, along with any photoresist that may be a part of layer 210, for example via a lift-off process, to form structure 211 which can include a thin "sensor" layer (and optionally a "gap" layer). It is appreciated that metal films 220 and 230 remain above layer 200, within the mark region.

Figure 2D:
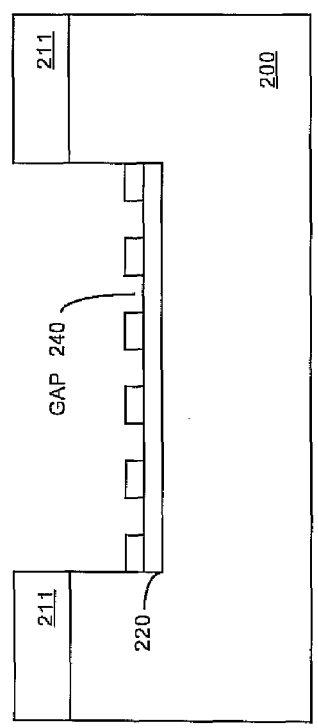

In FIG. 2D, portions of metal film 230 to create gaps, e.g., gap 240, within layer 230. Such gaps create rows of differing heights similar to those depicted in FIG. 1. The finished structure of FIG. 2D can be used as an alignment mark.

Figure 3:
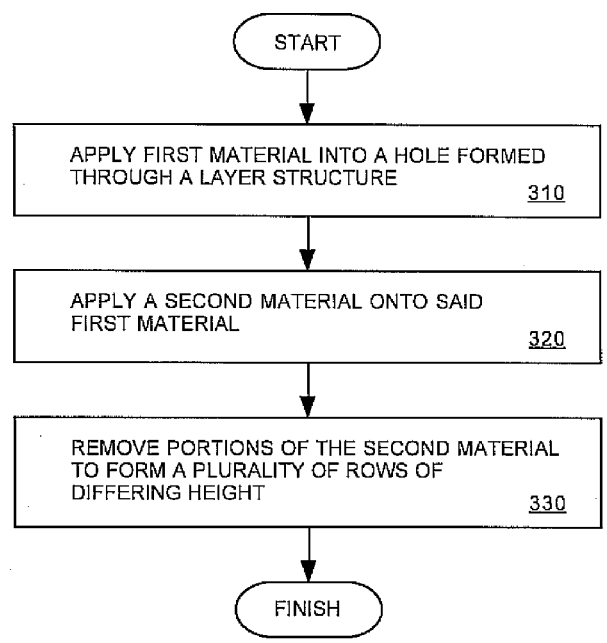
FIG. 3 is a flow chart of an exemplary process of manufacturing an alignment mark, in accordance with embodiments of the present invention.

FIG. 3 is a flow chart of a process 300 of manufacturing an alignment mark, in accordance with embodiments of the present invention. In block 310, a first material is applied into a hole formed through a layer structure. It is appreciated that the hole can be through and/or into multiple layers of a multi-layer structure. The layer structure can be a thin layer, e.g., significantly less than about 100 nm, that is unsuitable for a conventional alignment mark. The first material can be, for example, copper, applied to a thickness of about 100 nm.

In block 320, a second material is applied onto the first material. The second material can be, for example, rhodium, applied to a thickness of less than about 50 nm. The first and second materials can be of the group comprising tantalum, copper, rhodium, CoFe, NiFe, tungsten and gold.

In block 330, portions of the second material are removed to form a plurality of rows of differing height. For example, "tall" rows substantially comprise the second material, while "deep" rows or grooves are formed when the second material has been removed. The first material and the second material are selected to enhance the contrast of the alignment mark.

Embodiments in accordance with the present invention, methods and systems of enhancing stepper alignment signals and metrology alignment target signals, are thus described. While the present invention has been described in particular embodiments, it should be appreciated that the present invention should not be construed as limited by such embodiments, but rather construed according to the below claims.

Figure 4:
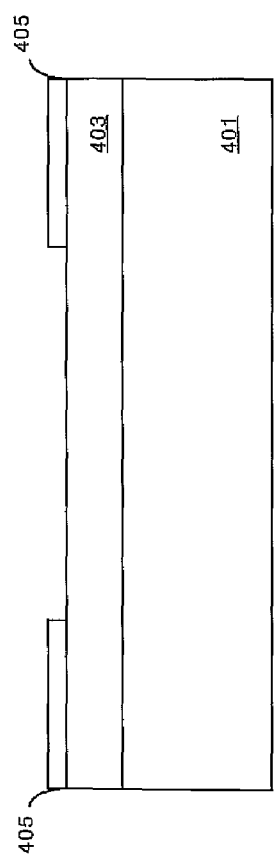
FIG. 4 shows an alignment mark stack according to one embodiment of the present invention.

II. Forming an Alignment Mark with Optically Mismatched Alignment Mark Stack Materials FIG. 4 shows an alignment mark stack 400 according to one embodiment of the present invention. In one embodiment, alignment mark stack 400 is formed using a process that yields an alignment mark that facilitates the complete alignment of the alignment mark with alignment marks of an alignment tool in a manner that is easy to perform and is easily repeatable. In one embodiment, this is accomplished by using optically mismatched metals in alignment mark stack 400 that significantly increase the phase delta of light reflected from higher and lower rows of an alignment mark (see discussion made herein with reference to structure 100 of FIG. 1). In one embodiment, this alignment mark stack configuration generates stronger signals than can be generated by alignment mark stack configurations that do not use optically mismatched metals and provides a signal that ensures a level of clarity that renders alignment uncomplicated even when shallow (less than 100 nm) alignment marks are used. FIG. 4 shows alignment mark base layer 401, optional alignment stack layer 403 and mark layer 405.

Referring to FIG. 4, in one embodiment, alignment mark base layer 401 can be formed from a metal that includes but is not limited to NiFe, Ta, Cu, Rh, CoFe, W and Au. It should be appreciated that although any of the aforementioned metals can be used as a suitable base material for purposes of mismatching with the metal used to form mark layer 405, in one embodiment, Au and Cu can provide beneficial results as it relates to the intensifying of shallow mark signals.

In one embodiment, mark layer 405 can be formed from a metal that includes but is not limited to NiFe, Ta, Cu, Rh, CoFe and W. In one embodiment, although any of the aforementioned metals can be used as a suitable mark layer 405 material for purposes of mismatching with the metal used to form alignment mark base layer 401, some of the metals can be selected because of unique properties that they possess. For example, in one embodiment, Cu can be used to form the mark layer metal to mismatch optically with a base layer formed with metal Rh which has superior chemical mechanical polishing (CMP) resistance properties.

In one embodiment, optional alignment stack layer 403 can be used to effectively increase step height without increasing the actual thickness of alignment mark 405. In one embodiment, this is because optional alignment stack layer 403 can be formed from an optically transparent material. In one embodiment, the optically transparent material can include but is not limited to Al2O3. In one embodiment, optional alignment stack layer 403 can range from 0 to 50 nanometers in thickness. In other embodiments, optional alignment stack layer 403 can include other ranges of thicknesses.

It should be appreciated that as discussed above, the optically mismatched materials utilized in alignment mark stack 400 significantly increase the strength of signals reflected therefrom as compared to signals reflected from alignment marks that include materials that are not optically mismatched. The strength of the reflected signals enable a reduction of the height of alignment marks so constructed because signals of sufficient strength to enable a complete alignment of alignment marks and alignment tool marks can be produced by alignment marks having less height. In exemplary embodiments, marks of significantly lesser step height than the conventional 100 nm are attainable (see discussions made with reference to FIGS. 6 and 7).

FIG. 5 shows a table 500 of exemplary performance results for various combinations of alignment mark "base layer" and alignment mark "mark layer" materials according to one embodiment. Table 500 lists "A" layer or alignment mark "mark layer" metals 501 vertically along the side of table 500 and "B" layer or alignment mark "base layer" metals 503 horizontally at the top of table 500. In FIG. 5, "A" layer metals 501 include Ta, Cu, Rh, CoFe, NiFe and W and "B" layer metals 503 include NiFe, Ta, Cu, Rh, CoFe and W. Also shown in FIG. 5 is a result 505 for a conventional Ta/Ta mark.

The values in table 500 represent percentage increases relative to a benchmark value. Accordingly, the larger the value in table 500, the greater the improvement over the benchmark value and thus the stronger the signal represented thereby. As is shown in table 500, many of the optically mismatched combinations of A layer 501 and B layer 503 metals, fabricated with an A layer 501 step height of 20 nm, provide excellent results (as compared to conventional non optically mismatched Ta/Ta alignment marks). For example, referring to FIG. 6, it should be appreciated that the performance of a 100 nm Ta/Ta alignment mark is not as good as the performance of the 20 nm CoFe/Cu alignment mark. In one embodiment, the performance of these "shallow marks" enable them to be used in association with very thin layers to provide accurate and repeatable alignment with such layers, e.g., thin sensor layers of devices such as magnetic recording heads. It should be appreciated that the results shown in the table are exemplary, and other results that similarly demonstrate the performance of alignment marks that employ optically mismatched alignment mark stack material may be obtained in other embodiments.

Figure 6:
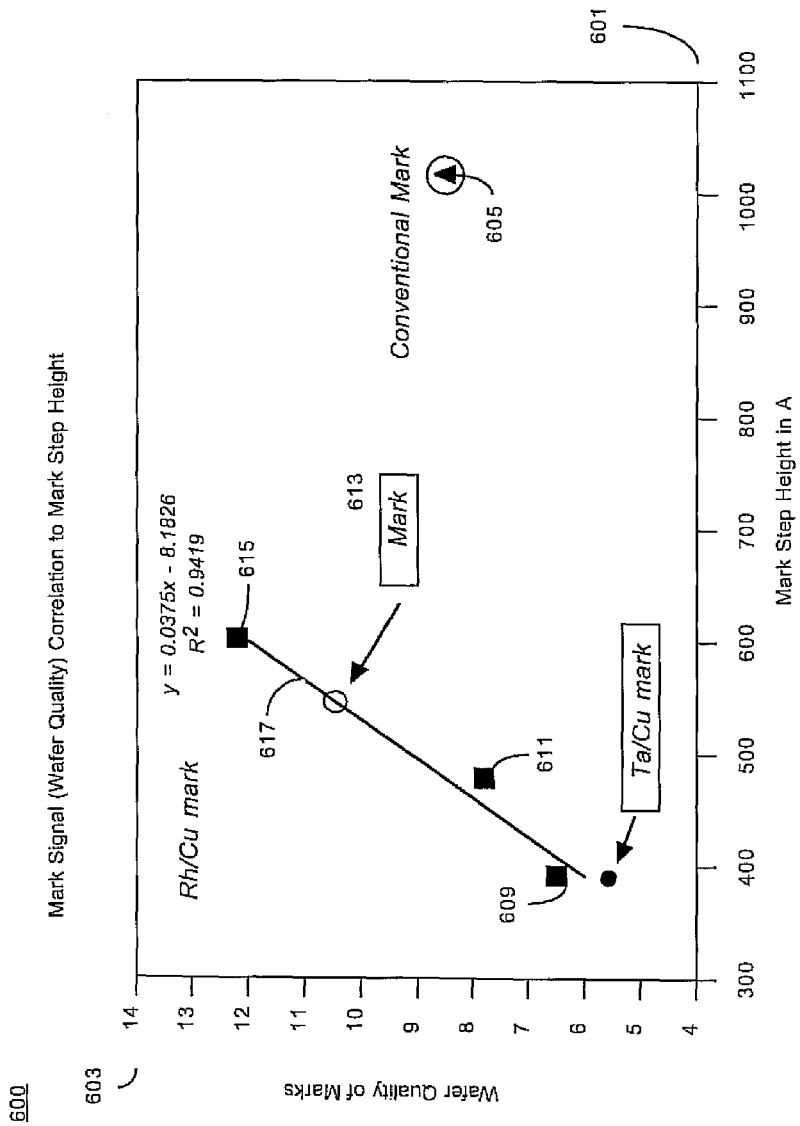
FIG. 6 is a graph that plots the strength of stepper signals as a function of mark step height of stepper signals that are produced using an alignment mark formed using a conventional process and alignment marks formed according to one embodiment of the present invention.

FIG. 6 is a graph 600 that plots the strength of stepper signals as a function of mark step height of signals that are produced using an alignment mark formed using a conventional process and alignment marks formed according to one embodiment of the present invention. FIG. 6 shows horizontal axis of graph 601, vertical axis of graph 603, conventional Ta mark result 605 and mark results for marks formed according to exemplary embodiments 607-615. In FIG. 6, the horizontal axis of graph 601 corresponds to mark step height and the vertical axis of graph 603 corresponds to stepper signal strength. Referring to FIG. 6, mark results for exemplary embodiments cluster around line 617. Importantly, the results for many of these marks, e.g., 611, 613 and 615, show that a stepper signal strength can be provided that is equal to or greater than the stepper signal strength that is provided by a conventional mark with result indicated at 605. Moreover, the stepper signal strength associated with results 611, 613 and 615 are provided by marks of far shorter step heights, e.g., less than 60 nanometers (600 angstroms), than the Ta mark 605 which has a step height of 100 nanometers.

Referring again to FIG. 6, it is important to note that graph 600 indicates that a conventional mark that has a conventional mark step height of 100 nanometers (1000 angstroms) produces a signal that has less strength than many of the marks of exemplary embodiments that have much smaller step heights (e.g., between 40 and 60 nanometers).

III. Process Flow for Forming an Alignment Mark with Optically Mismatched Alignment Mark Stack Materials FIGS. 7A-7L show a series of cross sections illustrating the process for forming an alignment mark that has optically mismatched alignment mark stack materials according to one embodiment of the present invention.

Figure 7A:
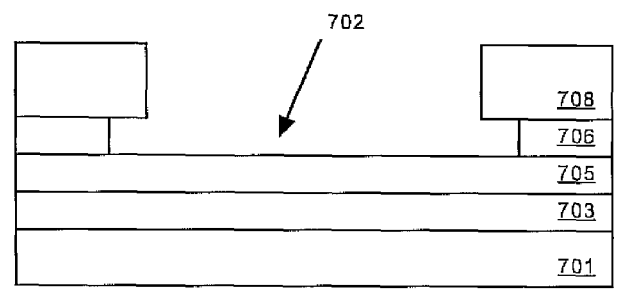
FIGS. 7A, 7B, 7C, 7D, 7E, 7F, 7G, 7H, 7I, 7J, 7K and 7L illustrate stages used in a process method of manufacturing an alignment mark according to one embodiment of the present invention.

Referring to FIG. 7A, in initial operations, after gap layer 703 and sensor layer 705 are formed on substrate 701, a photo operation is performed which enables the formation of an opening 702 for the alignment mark on gap layer 703 and sensor layer 705. Bi-layer photoresist 706 and 708 patterns the surface of the shown structure for subsequent operations.

Figure 7B:
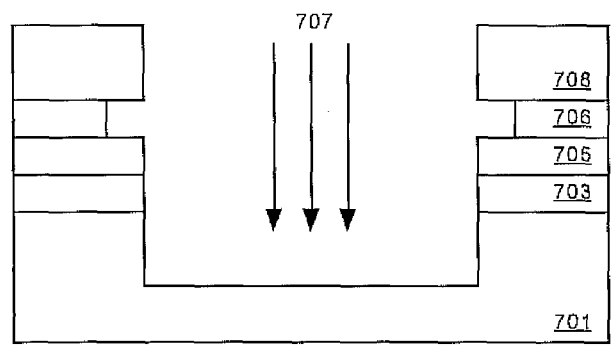

As shown in FIG. 7B, subsequent to one or more operations that result in the cross section shown in FIG. 7A, an iron milling operation 707 is performed through sensor layer 705, gap layer 703 and partially into substrate 701. In one embodiment, the ion milling operation 707 mills to a depth of 0.1 nm into substrate 701. In another embodiment, ion milling operation 707 can mill to other depths in substrate 201. It should be appreciated that bi-layer photoresist 706 and 708, gap layer 703 and sensor layer 705 together form a structure that is analogous to structure 210 shown in FIG. 2A (is a more detailed version of structure 210 of FIG. 2A).

Figure 7C:
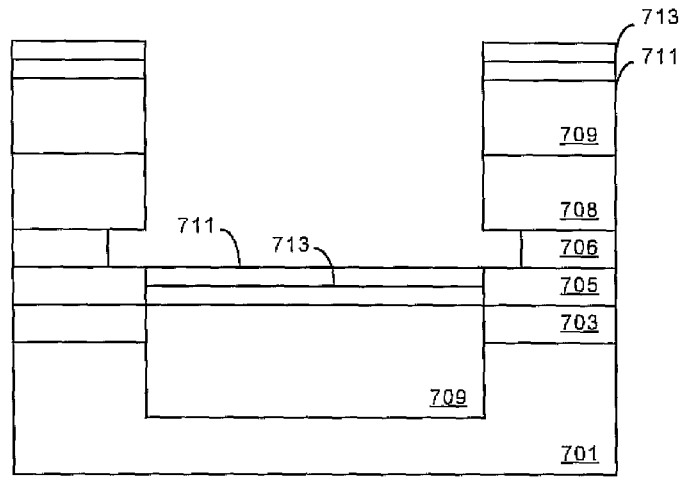

As shown in FIG. 7C, subsequent to one or more operations that result in the cross section shown in FIG. 7B, copper layer 709, rhodium layer 711 and tantalum layer 713 is formed in the opening made by milling operation 707. In one embodiment, an 80 nm copper layer, a 5 nm tantalum layer and a 25 nm rhodium layer can be formed. In other embodiments, these layers can be formed to other thicknesses.

Figure 7D:
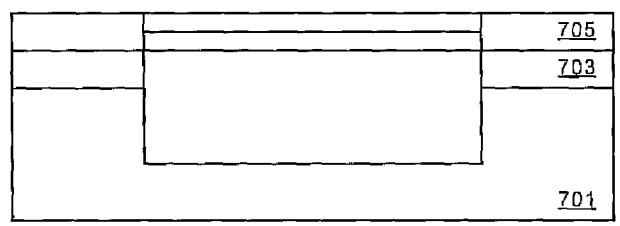

As shown in FIG. 7D, subsequent to the execution of one or more operations that result in the cross section shown in FIG. 7C, a lift off operation is performed. In one embodiment, the lift off operation removes material (including bi-layer photoresist 706 and 708) to prepare the structure for formation of the alignment mark. In FIG. 7D, gap layer 703 and sensor layer 705 together form a structure that is analogous to structure 211 shown in FIG. 2C.

Figure 7E:
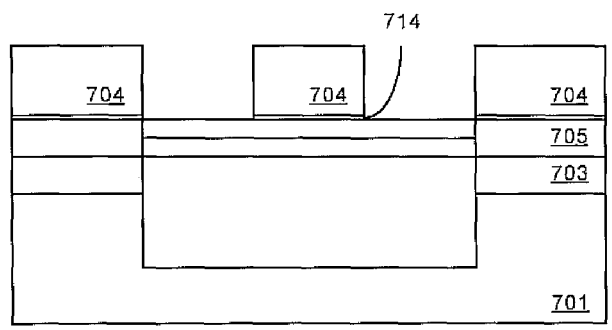

As shown in FIG. 7E, subsequent to the execution of one or more operations that results in the cross section shown in FIG. 7D, a photo print operation 704 is performed to pattern the alignment mark 714. Then, a diamond like carbon (DLC) reactive ion etch (RIE) is performed.

Figure 7F:
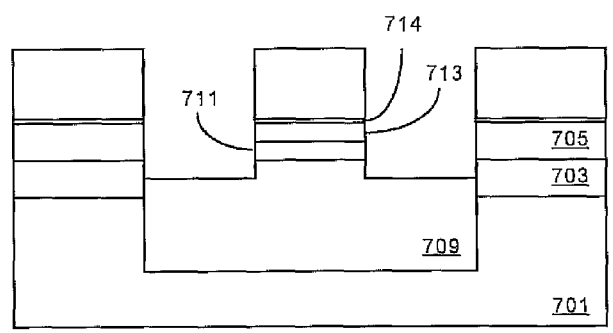

As shown in FIG. 7F, subsequent to the execution of one or more operations that result in the cross section shown in FIG. 7E, an ion mill operation defines marks in rhodium 713 and partially into copper 709.

Figure 7G:
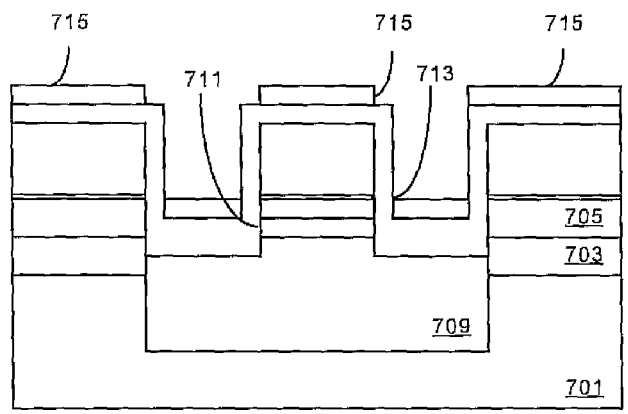

As shown in FIG. 7G, subsequent to the execution of one or more operations that result in the cross section shown in FIG. 7F, a post ion mill $Al_2O_3$ refill is performed. Thereafter, a 50 to 300 angstrom diamond like carbon (DLC) layer 715 is deposited. In other embodiments, the diamond like carbon (DLC) layer 715 can be deposited to other thicknesses.

Figure 7H:
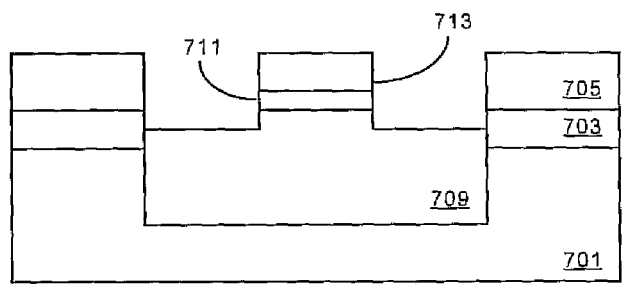

As shown in FIG. 7H, subsequent to the execution of one or more operations that result in the cross section shown in FIG. 7G, a chemical mechanical polishing and diamond like carbon (DLC) reactive ion etch (RIE) is performed resulting in the structure shown in FIG. 7H.

Figure 7I:
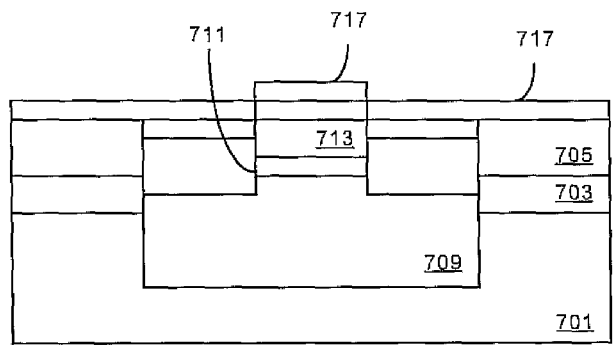

As shown in FIG. 7I, subsequent to the execution of one or more operations that result in the cross section shown in FIG. 7H, a diamond like carbon (DLC) layer 717 is deposited. In one embodiment, a 100 angstrom diamond like carbon (DLC) layer 717 is deposited. In other embodiments, a diamond like carbon (DLC) layer 717 of other thicknesses may be deposited.

Figure 7J:
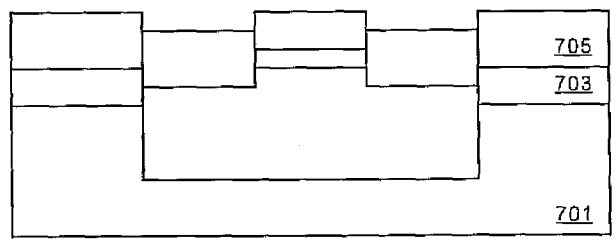

As shown in FIG. 7J, subsequent to the execution of one or more operations that result in the cross section shown in FIG. 7I, another diamond like carbon (DLC) layer 719 is deposited only in area of the mark to form a bi-layer DLC with diamond like carbon (DLC) layer 717. In one embodiment, a lift off process is used in the formation of diamond like carbon (DLC) layer 719 in the area of the mark. In one embodiment, a 100 angstrom diamond like carbon (DLC) layer 719 is deposited. In other embodiments, a diamond like carbon (DLC) layer 719 of other thicknesses can be formed.

Figure 7K:
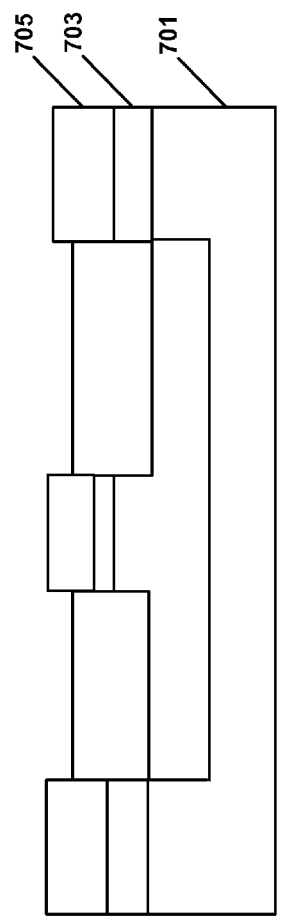

As shown in FIG. 7K, subsequent to the execution of one or more operations that result in the cross section shown in FIG.

7J, chemical mechanical polishing (CMP) and reactive ion etch (RIE) operations are performed (removing layers 717 and 719).

Figure 7L:
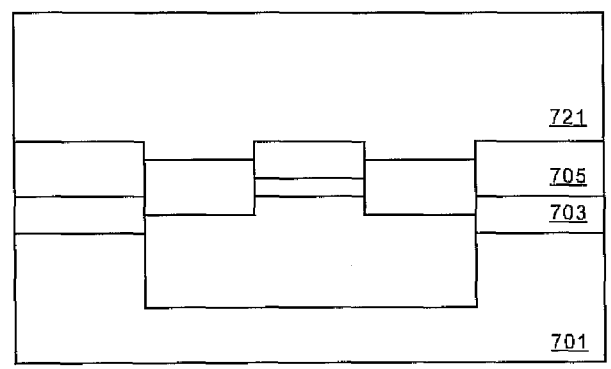

As shown in FIG. 7L, subsequent to the execution of one or more operations that result in the cross section shown in FIG. 7K, a post read/write $Al_2O_3$ deposition 721 is performed.

Figure 8:
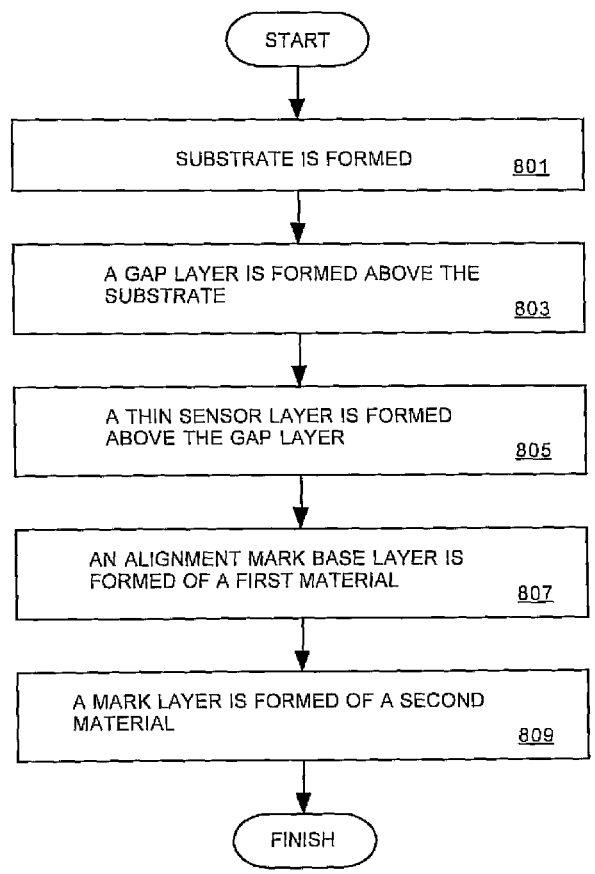
FIG. 8 shows a flowchart of steps performed in an exemplary process for forming an alignment mark with optically mismatched alignment mark stack materials according to one embodiment of the present invention.

IV. Method for Forming an Alignment Mark with Optically Mismatched Alignment Mark Stack Materials FIG. 8 shows a flowchart 800 of the steps performed in an exemplary process for forming an alignment mark with optically mismatched alignment mark stack materials according to one embodiment of the present invention. Although specific steps are disclosed in flowchart 800, such steps are exemplary.

Referring to FIG. 8, at step 801, a substrate is formed. At step 803, a gap layer is formed above the substrate. And, at step 805, a thin sensor layer is formed above the gap layer.

At step 807, an alignment mark base layer is formed. In one embodiment, the material used to form the alignment mark base layer can include but is not limited to NiFe, Ta, Cu, Rh, CoFe, W and Au.

At step 809, an alignment mark layer that comprises material that is optically mismatched with the material used to form the alignment mark base layer is formed. In one embodiment, the material used to form the alignment mark base layer can include but is not limited to NiFe, Ta, Cu, Rh, CoFe and W. In one embodiment, a bilayer diamond like carbon (DLC) process is used in the formation of the alignment mark. In one embodiment, the alignment mark can be formed to very small thicknesses and thus is well suited to use in association with a thin sensor layer to align layers that are formed subsequent to the formation of the thin sensor layer.

With reference to exemplary embodiments thereof, methods for fabricating an alignment mark are disclosed. A method includes forming a base layer that includes a first material and forming an alignment mark layer above the base layer that includes a second material that is optically mismatched with the first material. The alignment mark is formed using a bi-layer diamond like carbon (DLC) process.

Although many of the components and processes are described above in the singular for convenience, it will be appreciated by one of skill in the art that multiple components and repeated processes can also be used to practice the techniques of the present invention. Further, while the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed with a variety of components and should not be restricted to the ones mentioned above. It is therefore intended that the invention be interpreted to include all variations and equivalents that fall within the true spirit and scope of the present invention.

What is claimed is:

1. An alignment mark, comprising:
   a base layer comprising a first material;
   an alignment mark layer above said base layer and comprising a second material that is optically mismatched with said first material; and
   a variable thickness optically transparent $Al_2O_3$ spacer between said first material and said second material.

2. The alignment mark of claim 1 wherein said first material is selected from the group consisting of NiFe, Ta, Cu, Rh, CoFe, W and Au and said second material is selected from the group consisting of NiFe, Ta, Cu, Rh, Ir, Ru, CoFe and W.

\* \* \* \* \*